(12) United States Patent
Lai

(10) Patent No.: US 11,533,047 B2
(45) Date of Patent: Dec. 20, 2022

(54) WAVE-GENERATION CIRCUIT AND OPERATION SYSTEM UTILIZING THE SAME

(71) Applicant: Nuvoton Technology Corporation, Hsinchu Science Park (TW)

(72) Inventor: Yun-Kai Lai, Hsinchu Science Park (TW)

(73) Assignee: NUVOTON TECHNOLOGY CORPORATION, Hsinchu Science Park (TW)

( * ) Notice: Subject to any disclaimer, the term of this patent is extended or adjusted under 35 U.S.C. 154(b) by 0 days.

(21) Appl. No.: 17/581,199

(22) Filed: Jan. 21, 2022

(65) Prior Publication Data

US 2022/0345121 A1    Oct. 27, 2022

(30) Foreign Application Priority Data

Apr. 23, 2021    (TW) .................................. 110114631

(51) Int. Cl.
| | | |
|---|---|---|
| H03K 5/131 | (2014.01) | |
| H03M 1/82 | (2006.01) | |
| H03K 3/037 | (2006.01) | |
| H03K 5/135 | (2006.01) | |

(52) U.S. Cl.
CPC ............ *H03K 5/131* (2013.01); *H03K 3/037* (2013.01); *H03K 5/135* (2013.01); *H03M 1/822* (2013.01)

(58) Field of Classification Search
None
See application file for complete search history.

(56) References Cited

U.S. PATENT DOCUMENTS

| | | |
|---|---|---|
| 7,558,326 B1 | 7/2009 | Lyle et al. |
| 2019/0373687 A1* | 12/2019 | Williams ............... H05B 45/46 |

\* cited by examiner

*Primary Examiner* — Cassandra F Cox
(74) *Attorney, Agent, or Firm* — Muncy, Geissler, Olds & Lowe, P.C.

(57) ABSTRACT

A wave-generation circuit is provided. A core circuit establishes digital data. A fetch and calculation circuit generates a first data string and a second data string according to the digital data, outputs the first data string via a first pin, and outputs the second data string via a second pin. A latch circuit latches the first and second data strings. The latch circuit uses the first data string as first input data, and use the second data string as second input data. A digital-to-analog conversion circuit receives and converts the first input data and the second input data to generate a first output wave and a second output wave. After the core circuit establishes the digital data, the fetch and calculation circuit, the latch circuit, and the digital-to-analog conversion circuit operate independently of the core circuit to generate the first output wave and the second output wave.

20 Claims, 6 Drawing Sheets

WAVE-GENERATION CIRCUIT AND OPERATION SYSTEM UTILIZING THE SAME

CROSS REFERENCE TO RELATED APPLICATIONS

This Application claims priority of Taiwan Patent Application No. 110114631, filed on Apr. 23, 2021, the entirety of which is incorporated by reference herein.

BACKGROUND OF THE INVENTION

Field of the Invention

The invention relates to an electrical circuit, and more particularly to a wave-generation circuit.

Description of the Related Art

With technological development, the types and functions of electrical devices have increased. Each electrical device comprises many electrical elements. These electrical elements usually use a variety of waves, such as sine waves, square waves, sawtooth waves, and triangle waves. A conventional wave-generation circuit adjusts the duty cycle of the pulse width modulation (PWM) signal and uses external resistors and capacitors to generate a variety of waves. However, the external elements are easily affected by the ambient temperature such that the waves generated by the conventional wave-generation circuit are affected.

BRIEF SUMMARY OF THE INVENTION

In accordance with an embodiment, a wave-generation circuit comprises a core circuit, a fetch and calculation circuit, a latch circuit, and a digital-to-analog conversion circuit. The core circuit establishes digital data. The fetch and calculation circuit generates a first data string and a second data sting according to the digital data, outputs the first data string via a first pin, and outputs the second data string via a second pin. The latch circuit receives and latches the first data string and the second data string, using the first data string as first input data and the second data string as second input data. The digital-to-analog conversion circuit receives and converts the first input data and the second input data to generate a first output wave and a second output wave. After the core circuit establishes the digital data, the fetch and calculation circuit, the latch circuit, and the digital-to-analog conversion circuit operate independently of the core circuit to generate the first output wave and the second output wave.

In accordance with another embodiment, an operation system comprises a wave-generation circuit, an application circuit and a sensing circuit. The wave-generation circuit comprises a core circuit, a fetch and calculation circuit, a latch circuit, and a digital-to-analog conversion circuit. The core circuit establishes digital data. The fetch and calculation circuit generates a first data string, a second data string, and a third data string according to the digital data and outputs the first, second, and third data strings according to a sample time interval. The latch circuit receives and latches the first data string, the second data string, and the third data strings. The latch circuit uses the first data string, the second data string, and the third data string as first input data, second input data, and third input data, respectively. The digital-to-analog conversion circuit receives and converts the first input data, the second input data, and the third input data to generate a first output wave, a second output wave, and a third output wave. The application circuit operates according to the first, second, and third output waves. The sensing circuit detects the operation state of the application circuit to generate a feedback signal. After the core circuit establishes the digital data, the fetch and calculation circuit, the latch circuit, and the digital-to-analog conversion circuit operate independently of the core circuit to generate the first output wave and the second output wave. The fetch and calculation circuit adjusts the sample time interval to generate an updated sample time interval and outputs the first, second, and third data strings according to the updated time interval.

BRIEF DESCRIPTION OF THE DRAWINGS

The invention can be more fully understood by referring to the following detailed description and examples with references made to the accompanying drawings, wherein.

DETAILED DESCRIPTION OF THE INVENTION

Figure 1:
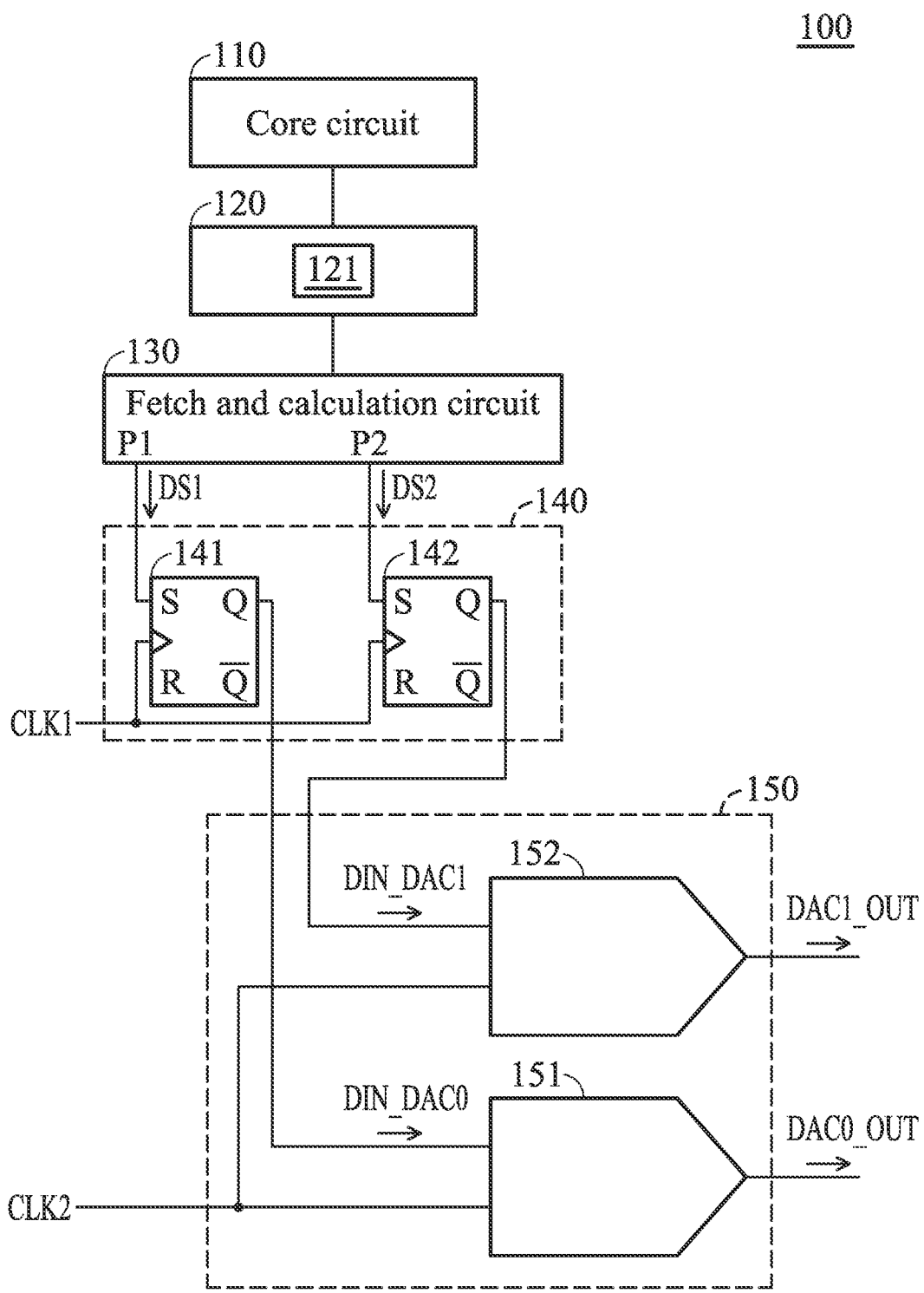
FIG. 1 is a schematic diagram of an exemplary embodiment of a wave-generation circuit, according to various aspects of the present disclosure.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the invention.

FIG. 1 is a schematic diagram of an exemplary embodiment of a wave-generation circuit, according to various aspects of the present disclosure. As shown in FIG. 1, the wave-generation circuit 100 comprises a core circuit 110, a fetch and calculation circuit 130, a latch circuit 140, and a digital-to-analog conversion circuit 150. In this embodiment, the fetch and calculation circuit 130, the latch circuit 140, and the digital-to-analog conversion circuit 150 operate independently of the core circuit 110. Since the core circuit 110 does not intervene in the operations of the fetch and calculation circuit 130, the latch circuit 140, and the digital-to-analog conversion circuit 150, the power consumption of the core circuit 110 can be reduced. Additionally, in an idle mode, the core circuit 110 is idle. In the idle mode, the fetch and calculation circuit 130, the latch circuit 140, and the digital-to-analog conversion circuit 150 continuously operate. Therefore, even when the core circuit 110 is idle, the fetch and calculation circuit 130, the latch circuit 140, and the digital-to-analog conversion circuit 150 continuously operate.

The core circuit 110 establishes digital data. In one embodiment, the core circuit 110 may establish a data table 121. The data table 121 records digital data. The core circuit 110 stores the data table 121 in a memory 120. The structure of the core circuit 110 is not limited in the present disclosure. In one embodiment, the core circuit 110 is a micro-controller unit (MCU). In another embodiment, the core circuit 110 is a portion of a MCU. In this case, the fetch and calculation circuit 130, the latch circuit 140, and the digital-to-analog conversion circuit 150 are another portion of the MCU.

The fetch and calculation circuit 130 generates data strings DS1 and DS2 according to the digital data recorded in the data table 121. In this embodiment, the fetch and calculation circuit 130 has pins P1 and P2. The pin P1 outputs the data string DS1 repeatedly. The pin P2 outputs the data string DS2 repeatedly. Each of the data strings DS1 and DS2 comprises the digital data in the data table 121. In one embodiment, the fetch and calculation circuit 130 fetches the digital data from the data table 121 to generate the data string DS1 according to a first predetermined sequence and fetches the digital data from the data table 121 to generate the data string DS2 according to a second predetermined sequence. The first predetermined sequence is different from the second predetermined sequence.

Figure 2:
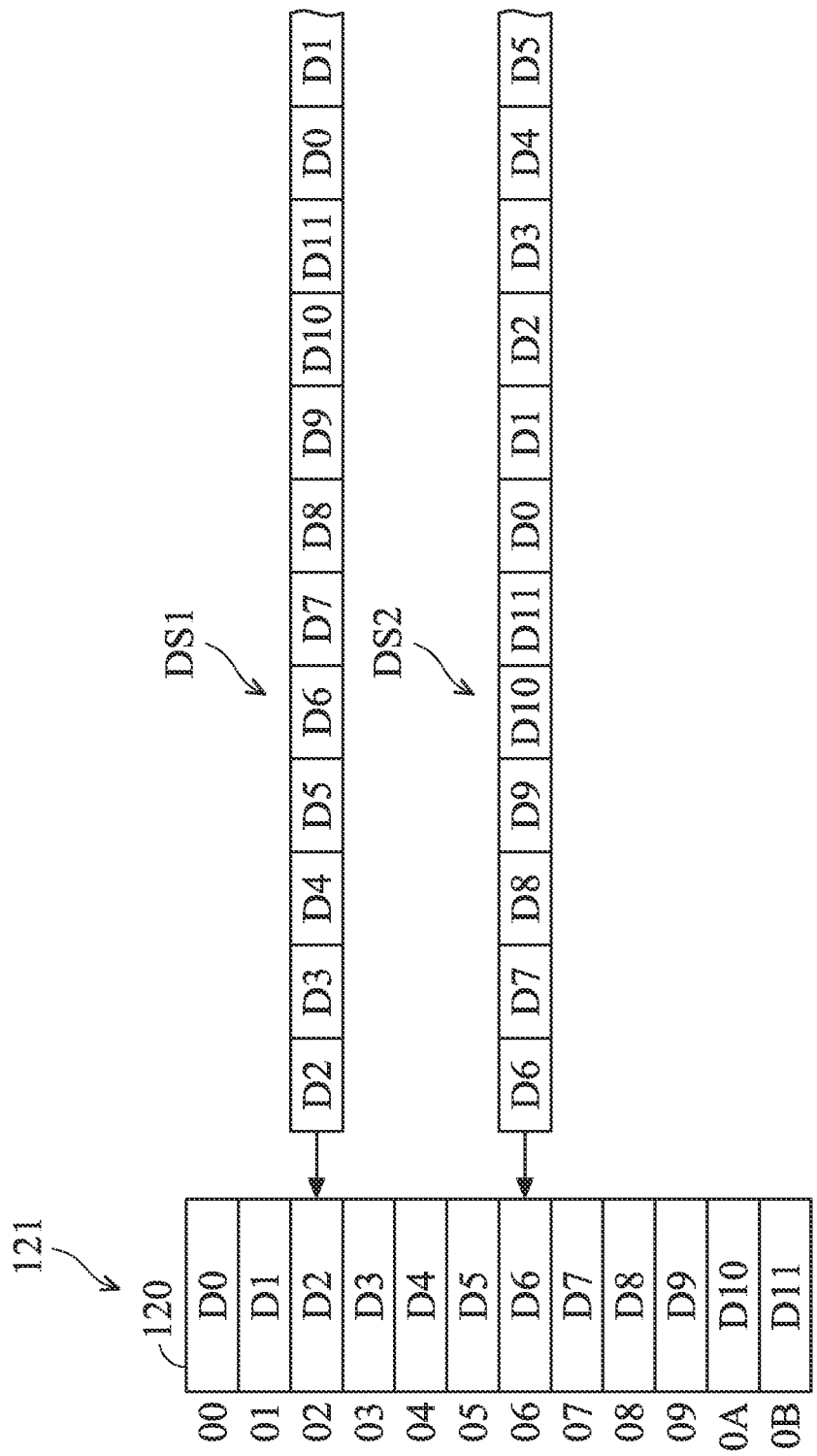
FIG. 2 shows the relationship between digital data in the data table and data strings.

FIG. 2 shows the relationship between the data strings DS1 and DS2, and the digital data in the data table 121. In this embodiment, the data table 121 comprises digital data D0~D11 and is stored in the memory 120. In one embodiment, the memory 120 comprises a plurality of memory cells. The different memory cells correspond to different addresses. In this case, the digital data D0~D11 are stored in the memory cells corresponding to the addresses 00~0B, respectively. In other embodiments, the digital data D0~D11 are stored in different registers. The amount of digital data in the data table 121 is not limited in the present disclosure. In some embodiments, the data table 121 may comprise more digital data or less digital data.

The fetch and calculation circuit 130 arranges the digital data D0~D11 to generate the data strings DS1 and DS2 according to a predetermined algorithm. For example, the fetch and calculation circuit 130 selects one of the addresses 00~0B as a first start address and selects another of the addresses 00~0B as a second start address according to the predetermined algorithm. In this case, the fetch and calculation circuit 130 may select the address 02 as the first start address. The fetch and calculation circuit 130 reads the digital data from the address 02 to generate the data string DS1. After reading the digital data D11 corresponding to the address 0B, the fetch and calculation circuit 130 reads the digital data from the address 00. Therefore, the data sequence of the data string DS1 is D2~D11, D0, and D1. Additionally, the fetch and calculation circuit 130 may serve the address 06 as the second start address. The fetch and calculation circuit 130 reads the digital data from the address 06 to generate the data string DS2. After reading the digital data D11 corresponding to the address 0B, the fetch and calculation circuit 130 reads the digital data from the address 00. Therefore, the data sequence of the data string DS2 is D6~D11 and D0~D5.

Furthermore, the fetch and calculation circuit 130 defines a sample time interval according to the predetermined algorithm. The fetch and calculation circuit 130 outputs the data of the data strings DS1 and DS2 according to the sample time interval. In one embodiment, the fetch and calculation circuit 130 may adjust the sample time interval according to a feedback signal and outputs the data of the data strings DS1 and DS2 according to the adjusted sample time interval.

Refer to FIG. 1, the latch circuit 140 receives and latches the data strings DS1 and DS2. In this embodiment, the latch circuit 140 is coupled to the pin P1 to receive the data string DS1. The latch circuit 140 latches the data string DS1 and outputs the latched data (referred to as input data) DIN_DAC0 according to a clock signal CLK1. In this case, the latch circuit 140 is further coupled to the pin P2 to receive the data string DS2 and outputs the latched data (referred to as input data) DIN_DAC1 according to the clock signal CLK1. In this embodiment, the latch circuit 140 provides the input data DIN_DAC1 and DIN_DAC0 simultaneously.

The structure of the latch circuit 140 is not limited in the present disclosure. In this embodiment, the latch circuit 140 comprises latches 141 and 142. The latch 141 is coupled to the pin P1 to receive and latch the data string DS1. The latch 141 uses the latched data string DS1 as the input data DIN_DAC0 according to the clock signal CLK1. The latch 142 is coupled to the pin P2 to receive and latch the data string DS2. The latch 142 uses the latched data string DS2 as the input data DIN_DAC1 according to the clock signal CLK1. In one embodiment, the latch 141 output the input data DIN_DAC0, and simultaneously, the latch 142 output the input data DIN_DAC1.

The kinds of latches 141 and 142 are not limited in the present disclosure. In one embodiment, each of the latches 141 and 142 is a SR flip-flop. In this case, the input terminal S of the latch 141 is coupled to the pin P1 to receive the data string DS1. The clock terminal of the latch 141 receives the clock signal CLK1. The output terminal Q of the latch 141 is configured to provide the input data DIN_DAC0. Additionally, the input terminal S of the latch 142 is coupled to the pin P2 to receive the data string DS2. The clock terminal of the latch 142 receives the clock signal CLK1. The output terminal Q of the latch 142 is configured to provide the input data DIN_DAC1.

The digital-to-analog conversion circuit 150 receives and converts the input data DIN_DAC0 and DIN_DAC1 to generate output waves DAC0_OUT and DAC1_OUT. In one embodiment, the digital-to-analog conversion circuit 150 further receives a clock signal CLK2. In this cases, the digital-to-analog conversion circuit 150 simultaneously converts the input data DIN_DAC0 and DIN_DAC1 to simultaneously generate the output waves DAC0_OUT and DAC1_OUT according to the clock signal CLK2. In some embodiment, the phase difference between the output waves DAC0_OUT and DAC1_OUT is fixed.

The structure of digital-to-analog conversion circuit 150 is not limited in the present disclosure. In this embodiment, the digital-to-analog conversion circuit 150 comprises digital-to-analog converters (DACs) 151 and 152. The DAC 151 converts the input data DIN_DAC0 to generate the output wave DAC0_OUT according to the clock signal CLK2. The DAC 152 converts the input data DIN_DAC1 to generate the output wave DAC1_OUT according to the clock signal CLK2. The kinds of the DACs 151 and 152 are not limited in the present disclosure. In one embodiment, each of the DACs 151 and 152 is a resistive DAC (RDAC).

Since the digital data provided by the fetch and calculation circuit 130 can be used by many DACs, the circuit size and the power consumption can be reduced. Additionally, the fetch and calculation circuit 130 simultaneously provides different digital data to the digital-to-analog conversion circuit 150. Therefore, the digital-to-analog conversion circuit 150 can provide multiple output waves.

In some embodiment, after the core circuit 110 establishes the digital data D0~D11, the core circuit 110 does not intervene the operation of the fetch and calculation circuit 130. At this time, the core circuit 110 may be idle to reduce the power consumption. Furthermore, since the memory 120 stores a single data table (121), the usable space of the memory 120 is increased. In other embodiment, the core circuit 110 may perform other operations different from the operation of the fetch and calculation circuit 130 to increase the usage rate of the core circuit 110.

Figure 3:
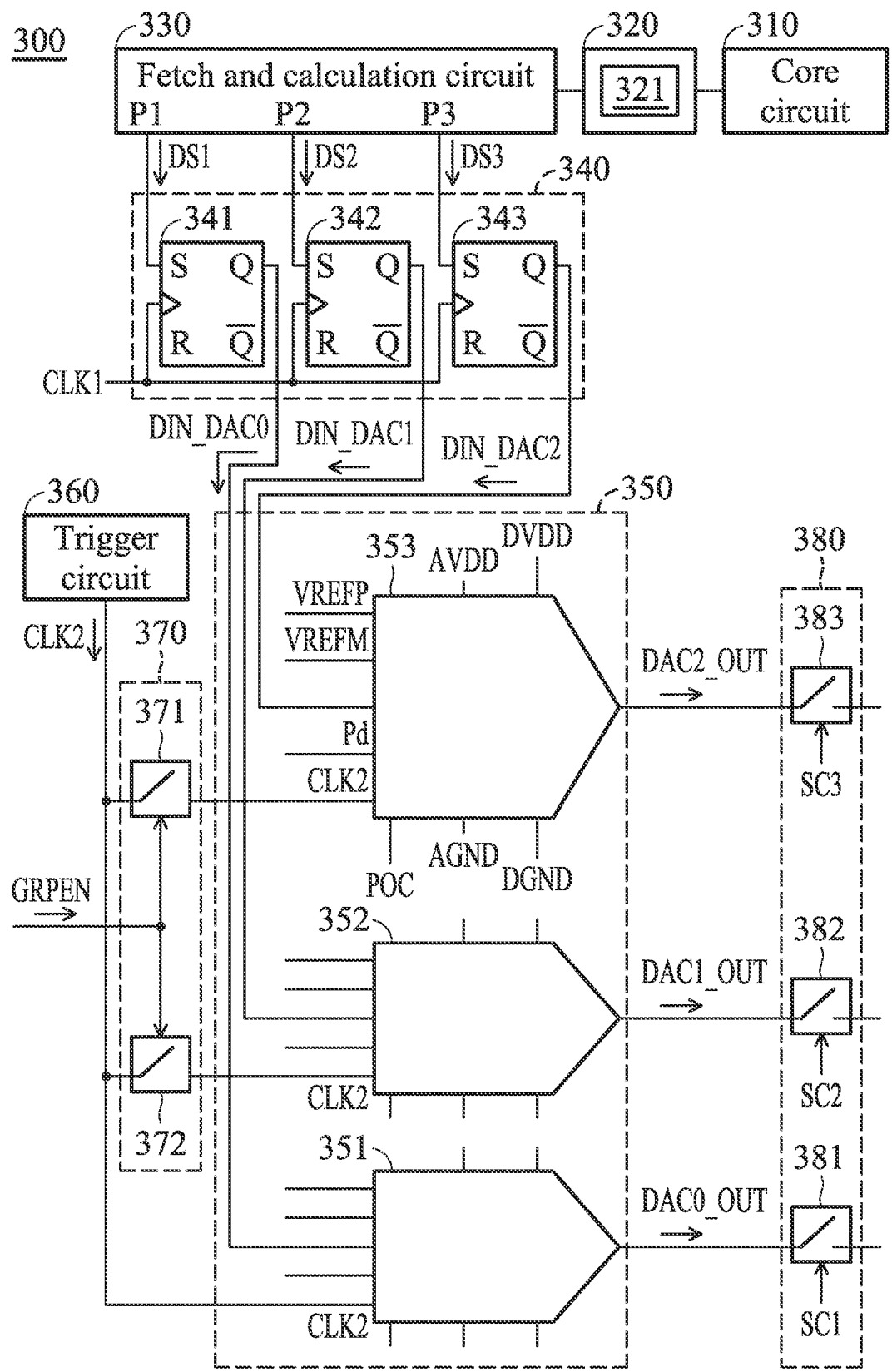
FIG. 3 is a schematic diagram of another exemplary embodiment of the wave-generation circuit, according to various aspects of the present disclosure.

FIG. 3 is a schematic diagram of another exemplary embodiment of the wave-generation circuit, according to various aspects of the present disclosure. The wave-generation circuit 300 comprises a core circuit 310, a fetch and calculation circuit 330, a latch circuit 340, and a digital-to-analog conversion circuit 350. Since the feature of the core circuit 310 is the same as the feature of the core circuit 110 of FIG. 1, the description of the feature of the core circuit 310 is omitted. Additionally, in the embodiment, the fetch and calculation circuit 330 further provides a data string DS3. In this case, the fetch and calculation circuit 330 has a pin P3 to output the data string DS3. Since the method generating the data string DS3 is the same as the method generating the data string DS1, the method generating the data string DS3 is omitted.

Figure 4:
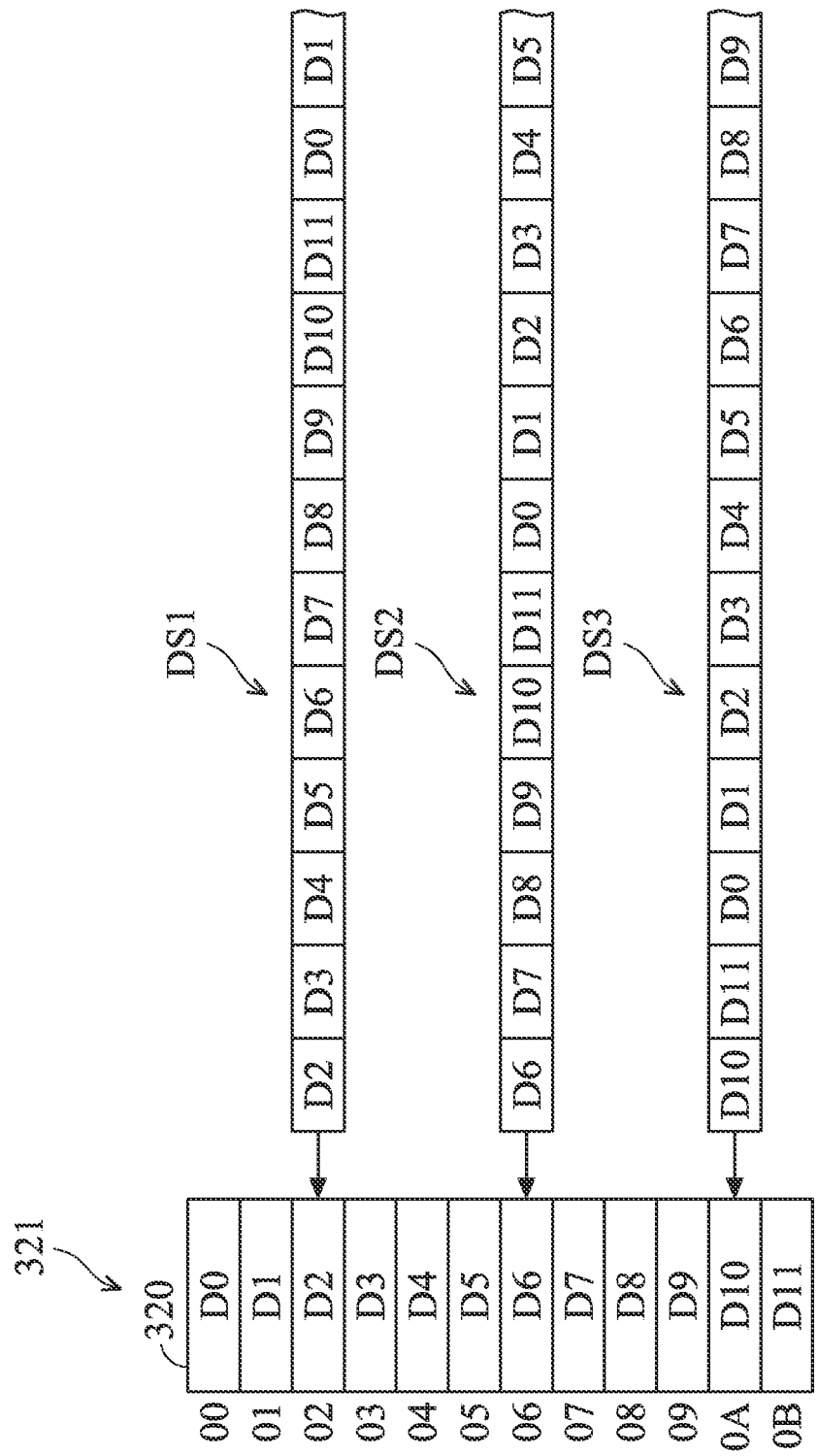
FIG. 4 shows another relationship between digital data in the data table and data strings.

FIG. 4 shows another relationship between the data table 321 and data strings DS1~DS3. The fetch and calculation circuit 330 uses the address 02 as a first start address, uses the address 06 as a second start address, and uses the address 0A as a third start address. In this case, the fetch and calculation circuit 330 reads the digital data from the address 02 to provide the data string DS1, reads the digital data from the address 06 to provide the data string DS2, and reads the digital data from the address 0A to provide the data string DS3. In this embodiment, the data sequence of the data string DS1 is D2~D11, D0 and D1, the data sequence of the data string DS2 is D6~D11 and D0~D5, and the data sequence of the data string DS3 is D10, D11 and D0~D9.

In some embodiments, when the fetch and calculation circuit 330 uses the different start addresses, the phase differences between the output waves are different from each other. For example, assume that the fetch and calculation circuit 330 reads the digital data from the address 02 and uses the read result as the data string DS1 and reads the digital data from the address 06 and uses the read result as the data string DS2. In such cases, a first phase difference occurs between the output waves DAC0_OUT and DAC1_OUT. However, if the fetch and calculation circuit 330 reads the digital data from the address 05 and uses the read result as the data string DS2, a second phase difference occurs between the output waves DAC0_OUT and DAC1_OUT. In this case, the second phase difference may be less than the first phase difference. In some embodiments, when the fetch and calculation circuit 330 reads the digital data from the address 07 and uses the read result as the data string DS2, a third phase difference occurs between the output waves DAC0_OUT and DAC1_OUT. In this case, the third phase difference may be larger than the first phase difference.

Refer to FIG. 3, the latch circuit 340 receives and latches the data strings DS1~DS3 and uses the latched data strings DS1~DS3 as the input data DIN_DAC0~DIN_DAC2 according to the clock signal CLK1. In this embodiment, the latch circuit 340 comprises latches 341~343. Since the features of the latches 341~343 are the same as the feature of the latch 141 of FIG. 1, the descriptions of the features of the latches 341~343 are omitted.

The digital-to-analog conversion circuit 350 receives and converts the input data DIN_DAC0~DIN_DAC2 to generate the output waves DAC0_OUT~DAC2_OUT. In one embodiment, the digital-to-analog conversion circuit 350 comprises DACs 351~353. The DAC 351 converts the input data DIN_DAC0 according to the clock signal CLK2 to generate the output wave DAC0_OUT. The DAC 352 converts the input data DIN_DAC1 according to the clock signal CLK2 to generate the output wave DAC1_OUT. The DAC 353 converts the input data DIN_DAC2 according to the clock signal CLK2 to generate the output wave DAC2_OUT. Since the features of DACs 351~353 are the same as the feature of DAC 151 shown in FIG. 1, the descriptions of the features of DACs 351~353 are omitted.

In one embodiment, the wave-generation circuit 300 further comprises a trigger circuit 360. The trigger circuit 360 generates the clock signal CLK2 to trigger the DACs 351~353. Take the DAC 351 as an example, when the DAC 351 receives the clock signal CLK2, the DAC 351 starts to convert the input data DIN_DAC0.

In this embodiment, the wave-generation circuit 300 further comprises a switch circuit 370. The switch circuit 370 is coupled between the trigger circuit 360 and the DACs 352 and 353. When a trigger event occurs, the switch circuit 370 transmits the clock signal CLK2 to the DACs 352 and 353. Therefore, the DACs 352 and 353 simultaneously operate. However, when the trigger event does not occur, the switch circuit 370 stops transmit the clock signal CLK2 to the DACs 352 and 353. Therefore, the DAC 351 operates and the DACs 352 and 353 do not operate.

The structure of switch circuit 370 is not limited in the present disclosure. In one embodiment, the switch circuit 370 comprises switches 371 and 372. The switch 371 is coupled to the trigger circuit 360 and the DAC 353 and receives the switching signal GRPEN. The switch 372 is coupled between the trigger circuit 360 and the DAC 352 and receives the switching signal GRPEN. When a trigger event occurs, the switching signal GRPEN is enabled. Therefore, the switches 371 and 372 are turned on. When there is no trigger event, the switching signal GRPEN is not enabled. Therefore, the switches 371 and 372 are not turned on.

In other embodiments, the switches 371 and 372 receive different switching signals. In such cases, when a trigger events occurs, a corresponding switching signal is enabled to turn on a corresponding switch. For example, when a first trigger event occurs, the switch 371 is turned on. When the first trigger event does not occur, the switch 371 is not turned on. In such cases, when a second trigger event occurs, the switch 372 is turned on. When the second trigger event does not occur, the switch 372 is not turned on.

In this embodiment, the DACs 351~353 further receive operation voltages AVDD, DVDD, AGND, and DGND. The operation voltages AVDD and AGND are configured to be used by analog elements disposed in the DACs. The operation voltage AVDD is higher than the operation voltage AGND. The operation voltages DVDD and DGND are used by digital elements in the DACs. The operation voltage DVDD may be higher than the operation voltage DGND.

In some embodiment, the DACs 351~353 further receives a power-on control signal PON. When the operation voltages AVDD, DVDD, AGND, and DGND are not stable, the power-on control signal PON is disabled. Therefore, the DACs 351~353 do not operate. When the operation voltages AVDD, DVDD, AGND, and DGND are stable, the power-on control signal PON is enabled. Therefore, the DACs 351~353 start to operate.

In other embodiments, the DACs 351~353 further receive reference voltages VREFP and VREFM. Taking the DAC 351 as an example, the DAC 351 may comprise a resistor string. The resistor string receives the reference voltages VREFP and VREFM and divides the reference voltage VREFP into many divided voltages. In one embodiment, the DAC 351 selects and outputs a corresponding divided voltage according to the values of the input data DIN_DAC0~DIN_DAC2.

In another embodiment, the DACs 351~353 further receive a power-down signal pd. In such cases, when the power-down signal pd is enabled, the DACs 351~353 enter a power down mode. In the power down mode, the DACs 351~353 stop operating.

In other embodiments, the wave-generation circuit 300 further comprises a switch circuit 380. The switch circuit 380 comprises switches 381~383. The switch 381 is coupled to the DAC 351. The switch 382 is coupled to the DAC 352. The switch 383 is coupled to the DAC 353. In this case, the switches 381~383 are controlled by the switching signals SC1~SC3, respectively. When a switching signal is enabled, a corresponding switch outputs a corresponding output wave. Taking the switch 383 as an example, when the switching signal SC3 is enabled, the switch 383 outputs the output wave DAC2_OUT. When the switching signal SC3 is not enabled, the switch 383 stops outputting the output wave DAC2_OUT.

Figure 5:
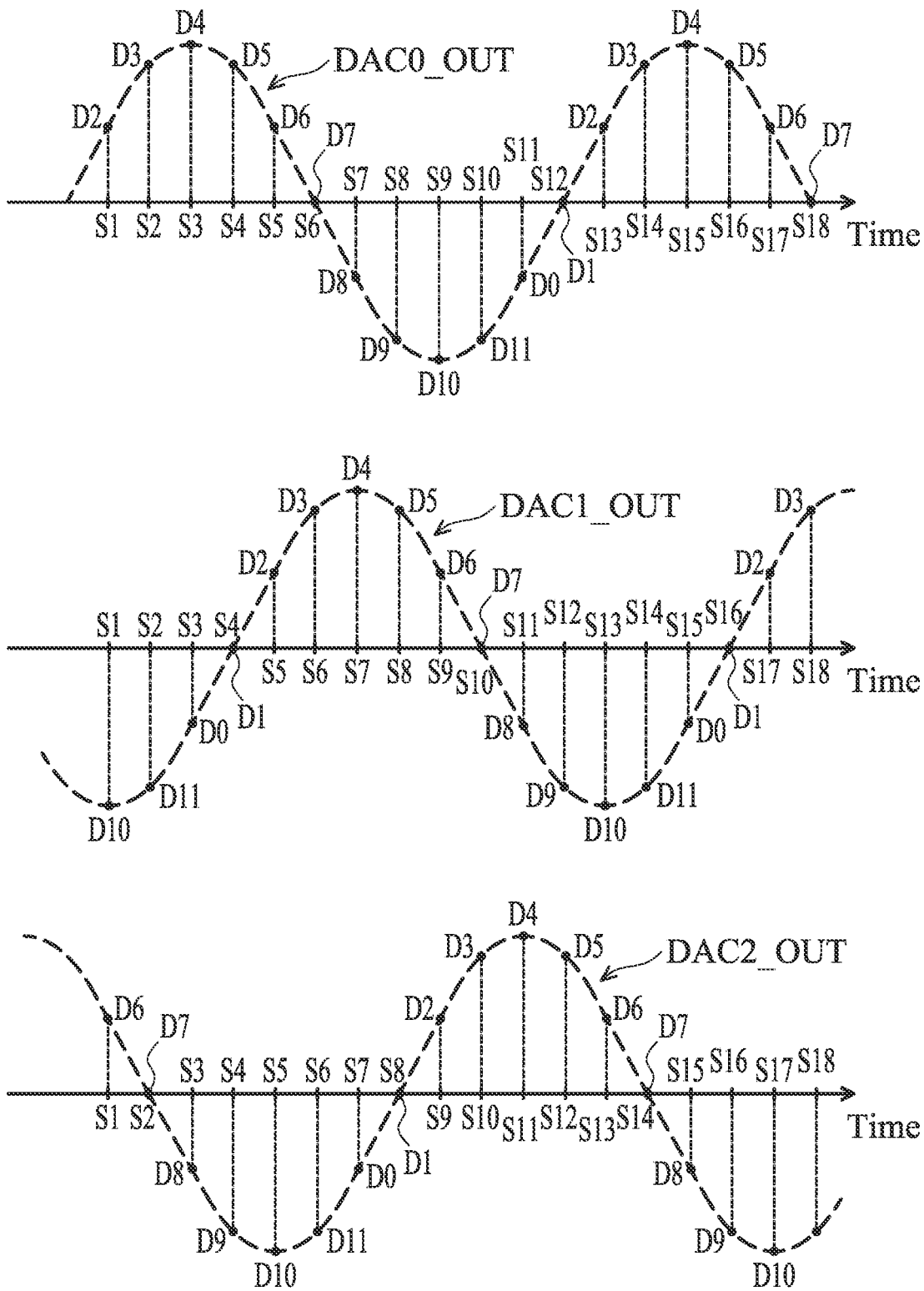
FIG. 5 is a schematic diagram of an exemplary embodiment of an output wave according to various aspects of the present disclosure.

FIG. 5 is a schematic diagram of an exemplary embodiment of the output waves DAC0_OUT~DAC2_OUT according to various aspects of the present disclosure. At sampling time points S1~S12, the fetch and calculation circuit 330 outputs the digital data D2~D11, D0 and D1 in order via the pin P1. In this case, the digital data D2~D11, D0 and D1 constitute the data string DS1. The latch circuit 341 latches the digital data D2~D11, D0 and D1 and outputs the latched digital data D2~D11, D0 and D1 in order according to the clock signal CLK1. The DAC 351 converts the digital data D2~D11, D0 and D1 into analog signals. In this embodiment, the output wave DAC0_OUT generated by the DAC 351 is a sinusoidal wave, but the disclosure is not limited thereto. In other embodiments, the values of the digital data D2~D11, D0 and D1 are adjusted to change the amplitude and the shape of the output wave DAC0_OUT. In some embodiments, each time interval between two corresponding neighboring sampling time points is adjusted to change the frequency of the output wave DAC0_OUT. When the data volume of the data string DS1 is larger, the output wave DAC0_OUT is smoother.

In this embodiment, at sampling time points S1~S12, the fetch and calculation circuit 330 outputs the digital data D10, D11 and D0~D9 in order via the pin P2. In this case, the digital data D10, D11 and D0~D9 constitute the data string DS2. The latch circuit 342 latches the digital data D10, D11 and D0~D9 and outputs the latched digital data D10, D11 and D0~D9 in order according to the clock signal CLK1. The DAC 352 converts the digital data D10, D11 and D0~D9 provided from the latch 342 into analog signals. In this embodiment, the output wave DAC1_OUT generated by the DAC 352 is also a sinusoidal wave.

At sampling time points S1~S12, the fetch and calculation circuit 330 outputs the digital data D6~D11 and D0~D5 in order via the pin P3. In this case, the digital data D6~D11 and D0~D5 constitute the data string DS3. The latch circuit 343 latches the digital data D6~D11 and D0~D5 and outputs the latched digital data D6~D11 and D0~D5 in order according to the clock signal CLK1. The DAC 353 converts the digital data D6~D11 and D0~D5 provided from the latch 343 into analog signals. In this embodiment, the output wave DAC2_OUT generated by the DAC 353 is also a sinusoidal wave.

In this embodiment, the phase differences between the output waves DAC0_OUT~DAC2_OUT are fixed. For example, the phase difference between the output waves DAC0_OUT and DAC1_OUT is 120 degrees, and the phase difference between the output waves DAC1_OUT and DAC2_OUT is 120 degrees. In other embodiments, after sampling time point S12, the fetch and calculation circuit 330 continually outputs the data strings DS1~DS3. Therefore, each of the DACs 351~353 generates a continuous sinusoidal wave.

Figure 6:
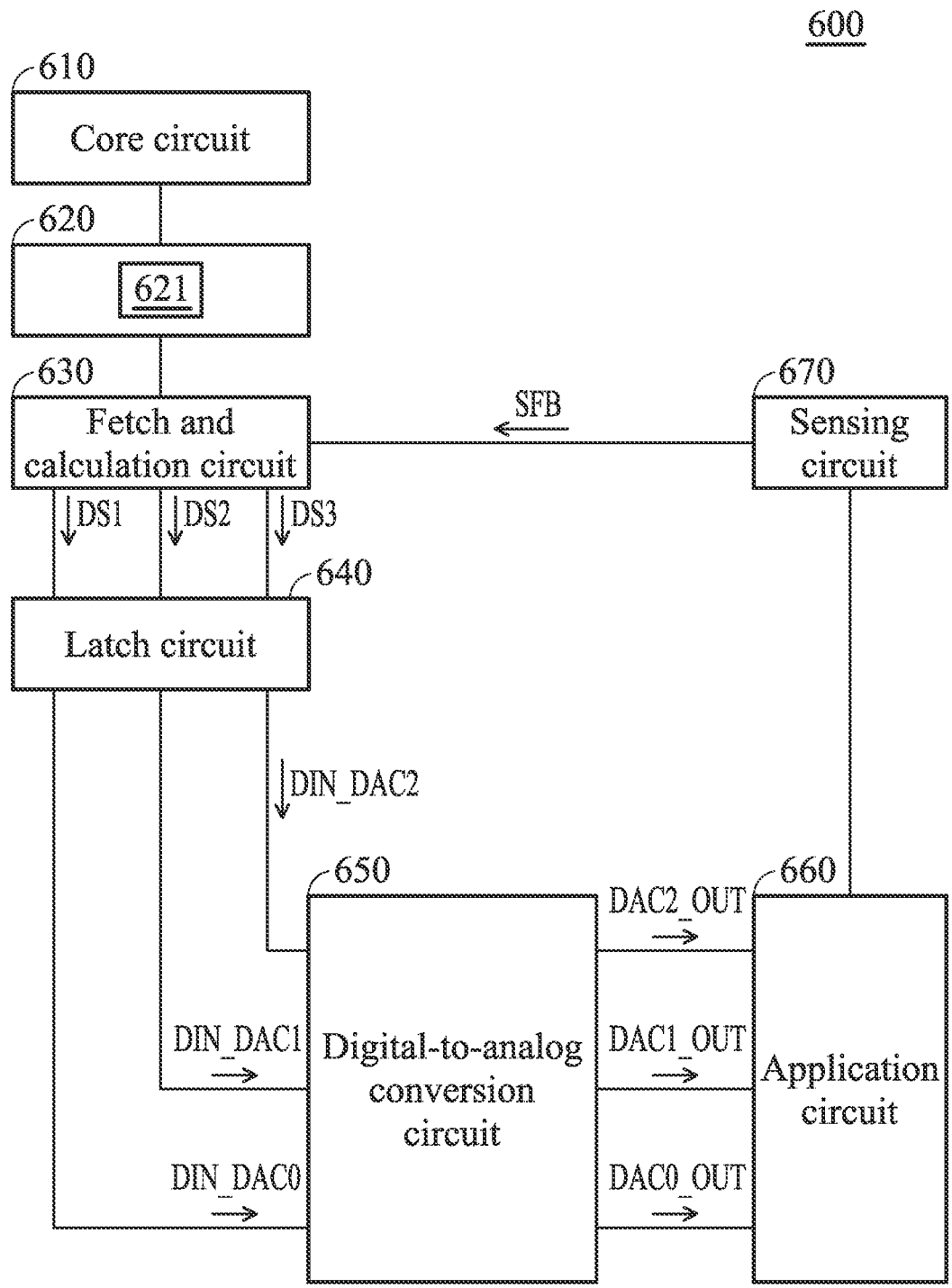
FIG. 6 is an application schematic diagram of an exemplary embodiment of the wave-generation circuit according to various aspects of the present disclosure.

FIG. 6 is an application schematic diagram of an exemplary embodiment of the wave-generation circuit according to various aspects of the present disclosure. An operation system 600 comprises a core circuit 610, a fetch and calculation circuit 630, a latch circuit 640, a digital-to-analog conversion circuit 650, an application circuit 660, and a sensing circuit 670. The core circuit 610 establishes digital data. In one embodiment, a data table 621 records the digital data established by the core circuit 610. In another embodiment, the operation system 600 further comprises a memory 620 to store the data table 621. Since the features of the core circuit 610 and the data table 621 are the same as the features of the core circuit 110 and the data table 121 of FIG. 1, the descriptions of the features of the core circuit 610 and the data table 621 are omitted.

The fetch and calculation circuit 630 generates data strings DS1~DS3 according to the digital data recorded in the data table 121. The fetch and calculation circuit 630 outputs the data strings DS1~DS3 according to a sample time interval. Each of the data strings DS1~DS3 comprises the digital data recorded in the data table 121. Since the method that is used by the fetch and calculation circuit 630 to generate the data strings DS1~DS3 is the same as the method that is used by the fetch and calculation circuit 130 of FIG. 1 to generate the data strings DS1~DS3, the method that is used by the fetch and calculation circuit 630 is omitted. In other embodiments, the fetch and calculation circuit 630 may generate more data strings or fewer data strings.

In this embodiment, the fetch and calculation circuit 630 adjusts the sample time interval according to a feedback signal SFB to generate a updated sample time interval. In such cases, the fetch and calculation circuit 630 outputs the data strings DS1~DS3 according to the updated sample time interval. In one embodiment, the fetch and calculation circuit 30 adjusts the sample time intervals between the sampling time points S1~S12. Taking the sampling time points S1 and S2 as an example, the fetch and calculation circuit 630 may reduce or increase the sample time interval between the sampling time points S1 and S2. In this case, the frequency of each of the output waves DAC0_OUT~DAC2_OUT is changed as each sample time interval between two corresponding sampling time points is changed.

The latch circuit 640 receives and latches the data strings DS1~DS3. The latch circuit 640 may serve the data string DS1 as input data DIN_DAC0, serve the data string DS2 as input data DIN_DAC1, and serve the data string DS3 as input data DIN_DAC2. Since the feature of the latch circuit 640 is the same as the feature of the latch circuit 140 of FIG. 1, the description of the feature of the latch circuit 640 is omitted. In this embodiment, the latch circuit 640 outputs the input data DIN_DAC0~DIN_DAC2 simultaneously.

The digital-to-analog conversion circuit 650 receives the input data DIN_DAC0~DIN_DAC2 and converts the input data DIN_DAC0~DIN_DAC2 from a digital format into an analog format. In such cases, the digital-to-analog conversion circuit 650 uses the analog signals as the output waves DAC0_OUT~DAC2_OUT. Since the feature of the digital-to-analog conversion circuit 650 is the same as the feature of the digital-to-analog conversion circuit 150 of FIG. 1, the description of the feature of the digital-to-analog conversion circuit 650 is omitted. In this embodiment, the digital-to-analog conversion circuit 650 provides the output waves DAC0_OUT~DAC2_OUT simultaneously.

The application circuit 660 operates according to the output waves DAC0_OUT~DAC2_OUT. The type of application circuit 660 is not limited in the present disclosure. In one embodiment, the application circuit 660 comprises a motor. In this case, the application circuit 660 may comprise an amplifier circuit (not shown). The amplifier circuit processes the output waves DAC0_OUT~DAC2_OUT to generate signal which is capable of driving the motor. Therefore, the motor operates according to the output waves DAC0_OUT~DAC2_OUT. In other embodiments, the application circuit 660 may comprise a speaker or a light emitting device. In such cases, the application circuit 660 issues audio or light.

The sensing circuit 670 senses the operation state of the application circuit 660 to generate the feedback signal SFB. In one embodiment, the sensing circuit 670 comprises at least one Hall sensor. The Hall sensor generates the feedback signal SFB according to the rotational speed of the motor. In this case, the fetch and calculation circuit 630 adjusts each sample time interval between two corresponding sampling time points shown in FIG. 5 according to the feedback signal SFB.

For example, in an initial period, the fetch and calculation circuit 630 first sets each time interval between two corresponding sampling time points (e.g., the sample time interval between two neighboring sampling time points shown in FIG. 5) according to a predetermined value. Each set time intervals is referred to as an sample time interval. Next, the fetch and calculation circuit 630 outputs the data strings DS1~DS3 according to the sample time intervals. At this time, the frequency of each of the output waves DAC0_OUT~DAC2_OUT may be equal to a first frequency (referred to as a predetermined frequency). When the fetch and calculation circuit 630 determines that the rotational speed of the motor is changed according to the feedback signal SFB, the fetch and calculation circuit 630 adjusts each sample time interval between two corresponding sampling time points. Each adjusted sample time interval is referred to as an updated sample time interval. The fetch and calculation circuit 630 outputs the data strings DS1~DS3 according to each updated sample time interval to adjust the frequency of each of the output wave output waves DAC0_OUT~DAC2_OUT. At this time, the frequency of each of the output waves DAC0_OUT~DAC2_OUT may be equal to a second frequency. In this case, the second frequency is different from the first frequency. In other embodiments, the sensing circuit 670 comprises an audio sensor or a photo sensor.

In some embodiments, the phase difference between the output waves DAC0_OUT and DAC1_OUT is 120 degrees, and the phase difference between the output waves DAC1_OUT and DAC2_OUT is also 120 degrees. In other embodiments, after the core circuit 610 establishes the digital data, the fetch and calculation circuit 630, the latch circuit 640, and the digital-to-analog conversion circuit 650 operate independently of the core circuit 610 to generate the output waves DAC0_OUT~DAC2_OUT. In this case, once the core circuit 610 establishes the digital data, the fetch and calculation circuit 630, the latch circuit 640 and the digital-to-analog conversion circuit 650 operates according to the digital data by themselves. The core circuit 610 does not intervene in the operations of the fetch and calculation circuit 630, the latch circuit 640 and the digital-to-analog conversion circuit 650.

In this embodiment, even if the core circuit 610 is idle, the fetch and calculation circuit 630, the latch circuit 640 and the digital-to-analog conversion circuit 650 still operate. Additionally, the application circuit 660 and the sensing circuit 670 also operate. In this case, since the fetch and calculation circuit 630 adjusts each interval between two neighboring sampling time points according to the feedback signal SFB, the core circuit 610 may perform other operations.

In other embodiments, when the fetch and calculation circuit 630 adjusts each interval between two corresponding sampling time points, the fetch and calculation circuit 630 may output three pieces of specific data such that the digital-to-analog conversion circuit 650 continually outputs three DC values which are different from each other. For example, the fetch and calculation circuit 630 may serve first specific data as the data string DS1, serve second specific data as the data string DS2 and serve third specific data as the data string DS3. Therefore, the output wave DAC0_OUT maintains at a first specific level, the output wave DAC1_OUT maintains at a second specific level, and the output wave DAC2_OUT maintains at a third specific level. In one embodiment, the first, second and third specific level are different from each other.

In some embodiments, the fetch and calculation circuit 630 pause to update the data strings DS1~DS3. In this case, when the magnetic flux of voltage received by the sensing circuit 670 arrives a predetermined value, the fetch and calculation circuit 630 starts adjusting each interval between two corresponding sampling time points. Since the core circuit 610 does not intervene the operation of adjusting each interval, the power consumption of the core circuit 610 is reduced. In other embodiments, when the output wave generated by the digital-to-analog conversion circuit 650 has an incomplete cycle, the digital-to-analog conversion circuit 650 continually outputs the corresponding output wave until the each cycle of the output wave is a complete cycle. When each cycle of the output wave is a complete cycle, the digital-to-analog conversion circuit 650 operates according to the adjusted input data.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). For example, it should be understood that the system, device and method may be realized in software, hardware, firmware, or any combination thereof. Therefore, the scope of the appended claims should be accorded the broadest interpretation so as to encompass all such modifications and similar arrangements.

What is claimed is:

1. A wave-generation circuit comprising:
   a core circuit establishing digital data;
   a fetch and calculation circuit generating a first data string and a second data string according to the digital data, outputting the first data string via a first pin, and outputting the second data string via a second pin;
   a latch circuit receiving and latching the first data string and the second data string, using the first data string as first input data, and using the second data string as second input data; and
   a digital-to-analog conversion circuit receiving and converting the first input data and the second input data to generate a first output wave and a second output wave,
   wherein after the core circuit establishes the digital data, the fetch and calculation circuit, the latch circuit, and the digital-to-analog conversion circuit operate independently of the core circuit to generate the first output wave and the second output wave.

2. The wave-generation circuit as claimed in claim 1, wherein even when the core circuit is idle, the fetch and calculation circuit, the latch circuit, and the digital-to-analog conversion circuit operate to generate the first output wave and the second output wave.

3. The wave-generation circuit as claimed in claim 1, wherein the latch circuit comprises:
   a first latch coupled to the first pin to receive the first data string and using the first data string as the first input data according to a first clock signal; and
   a second latch coupled to the second pin to receive the second data string and using the second data string as the second input data according to the first clock signal.

4. The wave-generation circuit as claimed in claim 3, wherein the digital-to-analog conversion circuit comprises:
   a first digital-to-analog converter converting the first input data to generate the first output wave according to a second clock signal; and
   a second digital-to-analog converter converting the second input data to generate the second output wave according to the second clock signal.

5. The wave-generation circuit as claimed in claim 4, further comprising:
   a third latch receiving a third data string and using the third data string as third input data according to the first clock signal; and
   a third digital-to-analog converter converting the third input data to generate a third output wave according to the second clock signal,
   wherein the fetch and calculation circuit generates the third data string according to the digital data and outputs the third data string via a third pin, and the third latch is coupled to the third pin.

6. The wave-generation circuit as claimed in claim 1, wherein the fetch and calculation circuit fetches the digital data to generate the first data string according to a first predetermined sequence and fetches the digital data to generate the second data string according to a second predetermined sequence, and the first predetermined sequence is different from the second predetermined sequence.

7. The wave-generation circuit as claimed in claim 1, wherein in response to a trigger event, the digital-to-analog conversion circuit starts to convert the first input data and the second input data.

8. The wave-generation circuit as claimed in claim 1, wherein each of the first input data and the second input data comprises the digital data.

9. The wave-generation circuit as claimed in claim 1, wherein:
   at a first sampling time point, the fetch and calculation circuit outputs first data of the first data string via the first pin, and outputs second data of the second data string via the second pin,
   at a second sampling time point, the fetch and calculation circuit outputs third data of the first data string via the first pin and outputs fourth data of the second data string via the second pin, and
   the third data is the same as the second data or the fourth data.

10. The wave-generation circuit as claimed in claim 1, wherein a phase difference between the first output wave and the second output wave is fixed.

11. An operation system comprising:
    a wave-generation circuit comprising:
       a core circuit establishing digital data;
       a fetch and calculation circuit generating a first data string, a second data string, and a third data string according to the digital data and outputting the first, second, and third data strings according to a sample time interval;
       a latch circuit receiving and latching the first data string, the second data string, and the third data strings and using the first data string, the second data string, and the third data string as first input data, second input data, and third input data respectively; and
       a digital-to-analog conversion circuit receiving and converting the first input data, the second input data, and the third input data to generate a first output wave, a second output wave, and a third output wave,
    an application circuit operating according to the first, second, and third output waves; and
    a sensing circuit detecting an operation state of the application circuit to generate a feedback signal,
    wherein:
    after the core circuit establishes the digital data, the fetch and calculation circuit, the latch circuit, and the digital-to-analog conversion circuit operate independently of the core circuit to generate the first output wave, the second output wave, and the third output wave,
    the fetch and calculation circuit adjusts the sample time interval to generate an updated sample time interval and outputs the first, second, and third data strings according to the updated time interval.

12. The operation system as claimed in claim 11, wherein a phase difference between the first output wave and the second output wave is 120 degrees, and a phase difference between the second output wave and the third output wave is 120 degrees.

13. The operation system as claimed in claim 12, wherein the application circuit comprises a motor, the sensing circuit comprises at least one Hall sensor, and the Hall sensor generates the feedback signal according to a rotational speed of the motor.

14. The operation system as claimed in claim 11, wherein:
    in response to the fetch and calculation circuit outputting the first, second, and third data strings according to the sample time interval, the frequency of each of the first, second, and third output waves is equal to a predetermined frequency, in response to the fetch and calculation circuit outputting the first, second, and third data strings according to the updated sample time interval, the frequency of each of the first, second, and third output waves is not equal to the predetermined frequency.

15. The operation system as claimed in claim 11, wherein even when the core circuit is idle, the fetch and calculation circuit, the latch circuit, the digital-to-analog conversion circuit, the application circuit, and the sensing circuit operate to generate the first output wave, the second output wave, and the third output wave continuously.

16. The operation system as claimed in claim 15, wherein even when the core circuit is idle, the fetch and calculation circuit adjusts the sample time interval to adjust the frequencies of the first, second, and third output waves according to the feedback signal.

17. The operation system as claimed in claim 11, wherein in response to the fetch and calculation circuit adjusting the sample time interval, the fetch and calculation circuit outputs first specific data, second specific data, and third specific data to the latch circuit such that the first, second, and third output waves are at a first specific level, a second specific level, and a third specific level respectively.

18. The operation system as claimed in claim 17, wherein the first, second, and third specific levels are different from each other.

19. The operation system as claimed in claim 1, wherein each of the first, second, and third data strings comprises the digital data.

20. The operation system as claimed in claim 11, wherein the latch circuit outputs the first input data, the second input data, and the third input data simultaneously, and the digital-to-analog conversion circuit generates a first output wave, a second output wave, and a third output wave simultaneously.

* * * * *